United States Patent [19]

Matsumoto et al.

[11] Patent Number: 4,859,882
[45] Date of Patent: Aug. 22, 1989

[54] SENSE AMPLIFIER

[75] Inventors: Osamu Matsumoto, Yokohama; Isao Abe, Kawasaki; Takeshi Nakashiro, Yokohama, all of Japan

[73] Assignee: Kabushiki Kaisha Toshiba, Kawasaki, Japan

[21] Appl. No.: 280,854

[22] Filed: Dec. 7, 1988

[30] Foreign Application Priority Data

Dec. 16, 1987 [JP] Japan .................. 62-317861

[51] Int. Cl.4 .............. G11C 7/06; G11C 9/00; G11C 11/40; G11C 17/04
[52] U.S. Cl. .................. 307/530; 307/468; 307/585; 365/104; 365/196
[58] Field of Search ............. 307/530, 354, 270, 571, 307/581, 584, 482, 468, 362, 279; 365/103, 104, 195, 196, 208

[56] References Cited

U.S. PATENT DOCUMENTS

| | | | |
|---|---|---|---|
| 4,348,601 | 9/1982 | Kitamura | 307/530 |
| 4,535,259 | 8/1985 | Smarandoiu et al. | 307/530 |
| 4,634,890 | 1/1987 | Lee | 307/530 X |
| 4,692,642 | 9/1987 | Fukuzo et al. | 307/530 |
| 4,742,253 | 5/1988 | Giebel | 307/530 |
| 4,788,460 | 11/1980 | Kobatake | 307/530 |
| 4,802,138 | 1/1989 | Shimamune | 307/530 X |
| 4,804,871 | 2/1989 | Walters, Jr. | 307/530 |

OTHER PUBLICATIONS

Pathak et al., "A 19-ns 250-mW CMOS Erasable Programmable Logic Device," IEEE Journal of Solid-State Circuits, vol. SC-21, No. 5, pp. 775-784, Oct. 1986.
Knecht et al., "A High-Speed Ultra-Low Power 64K CMOS EPROM with On-Chip Test Functions," IEEE Journal of Solid-State Circuits, vol. SC-18, No. 5, pp. 554-561, Oct. 1983.

Primary Examiner—John S. Heyman
Assistant Examiner—David R. Bertelson
Attorney, Agent, or Firm—Finnegan, Henderson, Farabow, Garrett, & Dunner

[57] ABSTRACT

A sense amplifier of the invention includes a PMOS transistor, the source and the drain of which are respectively connected to a power source and an EP-ROM as a signal source to be detected, and the gate and the drain of which are controlled to be at the same potential, a PMOS transistor connected to the power source and the EP-ROM in parallel with the PMOS transistor, and a ratio circuit in which the gate of one PMOS transistor and an NMOS transistor constituting a CMOS transistor is connected to the signal source. This arrangement of the invention enables a high speed operation.

9 Claims, 1 Drawing Sheet

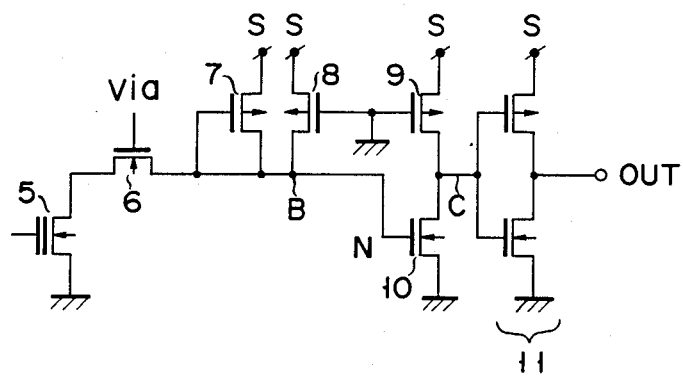
F I G. 2
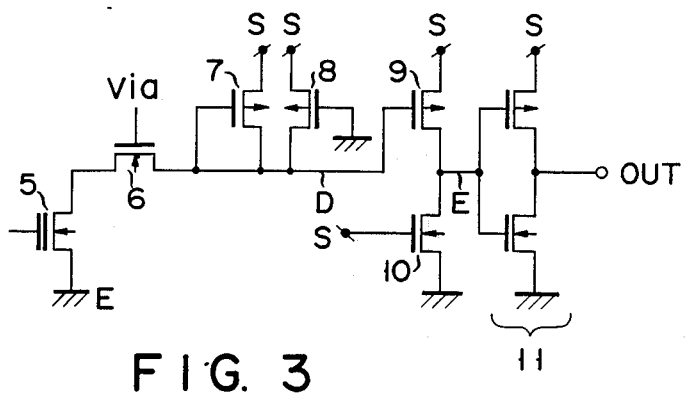
F I G. 3

SENSE AMPLIFIER

BACKGROUND OF THE INVENTION

1. Field of the Invention

The present invention relates to a sense amplifier and, more particularly, to a sense amplifier used in an EP-ROM (Erasable Programmable ROM) and a logic MOS IC incorporating an EP-ROM.

2. Description of the Related Art

FIG. 1 shows a conventional sense amplifier using an EP-ROM as a signal source to be detected. Referring to FIG. 1, the source of EP-ROM 1 as the signal source to be detected is grounded, and its drain is connected to the source of n-channel MOS transistor 2 (to be simply referred to as an NMOS transistor hereinafter). The drain of NMOS transistor 2 is connected to the drain of p-channel MOS transistor 3 (to be simply referred to as a PMOS transistor hereinafter) and the input terminal of CMOS two-stage inverter 4. Power source S is connected to the source of PMOS transistor 3, whose gate is grounded. Voltage Via is applied to the gate of NMOS transistor 2 so as to turn on NMOS transistor 2. Note that the ON resistance of PMOS transistor 3 is set to be sufficiently larger than the sum of the ON resistances of EP-ROM 1 and NMOS transistor 2.

An operation principle of the conventional sense amplifier will be described below.

When EP-ROM 1 is ON, both NMOS transistor 2 and PMOS transistor 3 are rendered conductive. As a result, current flows from power source S to ground E through PMOS transistor 3, NMOS transistor 2, and EP-ROM 1. When the current flows in this manner, since the ON resistance of PMOS transistor 3 is set to be sufficiently larger than the sum of the ON resistances of EP-ROM 1 and NMOS transistor 2, a great voltage drop occurs across PMOS transistor 3, and the potential at drain (point A) of PMOS transistor 3 becomes substantially 0 V. Since the potential at point A becomes close to 0 V, output OUT is set to 0 V through two-stage inverter 4.

On the other hand, when EP-ROM 1 is OFF, NMOS transistor 2 is rendered nonconductive, and PMOS transistor 3 is rendered conductive. As a result, the potential at point A is pulled up to power source voltage $V_{DD}$ by PMOS transistor 3. When the potential at point A is set to power source voltage $V_{DD}$, output OUT is set to power source voltage $V_{DD}$ through inverter 4.

Note that NMOS transistor 2 is a transistor for voltage control, and is used to prevent a high voltage from being applied to be sense amplifier when data is written in an EP-ROM cell.

A drawback of the above-described prior art is that the operation speed of the sense amplifier is low. That is, a considerably long period of time is required to cause the potential at the darin (point A) of PMOS transistor 3 to rise from 0 V to $V_{DD}$ when EP-ROM 1 is turned off. This is because charging speeds of circuit capacitances such as a wiring capacitance and capacitances of the diffusion layers of NMOS and PMOS transistors 2 and 3 are slow. The charging speeds are slow because the ON resistance of PMOS transistor 3 is large. In order to increase the charging speeds, the ON resistance of PMOS transistor 3 may be decreased. If, however, the ON resistance of PMOS transistor 3 is set to be smaller than the sum of ON resistances of EP-ROM 1 and NMOS transistor 2, a voltage drop across PMOS transistor 3 is small and the potential at point A becomes higher than $V_{DD}/2$ when EP-ROM 1 is turned on. It is very difficult to set the threshold of the first-stage inverter of two-stage inverter 4 to a value between potential $V_{DD}/2$ and power source voltage $V_{DD}$ because of variations in actual transistor characteristics. Therefore, the ON resistance of PMOS transistor 3 must be set to be large, resulting in a decrease in operation speed of the sense amplifier.

As described above, the operation speed of the conventional sense amplifier is low, and hence is not suitable for a circuit requiring a high speed operation. For this reason, a circuit employing the conventional sense amplifier cannot be operated in higher frequency regions or cannot process a large amount of data, and has significant drawbacks in terms of cost, reliability, and performance.

SUMMARY OF THE INVENTION

It is an object of the present invention to provide a sense amplifier capable of increasing the operation speed.

According to a first characteristic feature of the present invention, a signal line of a signal source to be detected is connected to the gate and one end of a channel conductive path of a first MOS transistor of a first channel type, one end of a channel conductive path of a second MOS transistor of the first channel type, and the gate of a MOS transistor of a second channel type constituting a CMOS ratio circuit, one end of a channel conductive path of a third MOS transistor of the first channel type also constituting the CMOS ratio circuit is connected to one end of the channel conductive path of the MOS transistor of the second channel type, a first potential applying terminal is connected to the other end of each of the channel conductive paths of the first, second, and third MOS transistor of the first channel type, a second potential applying terminal is connected to the other end of the channel conductive path of the MOS transistor of the second channel type, and a voltage is applied to the gates of the second and third MOS transistor of the first channel type so as to turn them on. According to a second characteristic feature of the present invention, a signal line of a signal source to be detected is connected to the gate and one end of a channel conductive path of a first MOS transistor of a first channel type, one end of a channel conductive path of a second MOS transistor of the first channel type, and the gate of a third MOS transistor of the first channel type constituting a CMOS ratio circuit, a channel conductive path of the third MOS transistor of the first channel type is connected to one end of a channel conductive path of a MOS transistor of a second channel type also constituting the CMOS ratio circuit, a first potential applying terminal is connected to the other end of each of the channel conductive paths of the first, second, and third MOS transistors of the first channel type, a second potential applying terminal is connected to the other end of the channel conductive path of the MOS transistor of the second channel type, and a voltage is applied to the gates of the second MOS transistor of the first channel type and the MOS transistor of the second channel type so as to turn them on.

According to the characteristic features of the present invention, in a sense amplifier, a PMOS transistor whose gate and drain are set to the same potential and a PMOS transistor having a gate to which a certain voltage is applied are connected to a signal line of a signal source to be detected in parallel, and the signal source is connected to one of the gates of a PMOS transistor and an NMOS transistor of CMOS transistors constituting a ratio circuit. With this circuit arrangement, the operation speed of the sense amplifier can be greatly increased, and hence the sense amplifier can be applied to a circuit requiring a high speed operation.

BRIEF DESCRIPTION OF THE DRAWINGS

FIG. 2 is a circuit diagram of a sense amplifier according to an embodiment of the present invention; and FIG. 3 is a circuit diagram of a sense amplifier according to another embodiment of the present invention.

DETAILED DESCRIPTION OF THE PREFERRED EMBODIMENTS

Figure 1:
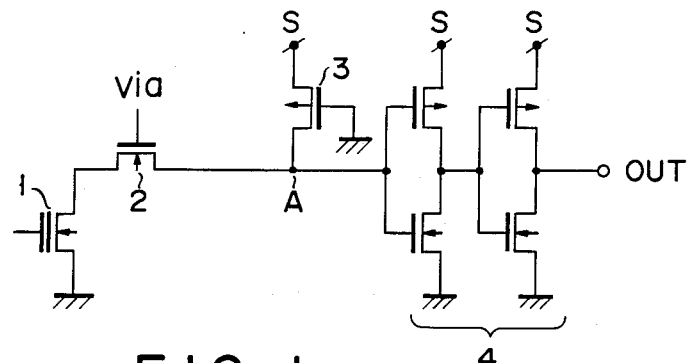
FIG. 1 is a circuit diagram of a conventional sense amplifier.

FIGS. 2 and 3 show sense amplifiers according to embodiments of the present invention. Both the sense amplifiers shown in FIGS. 2 and 3 use an EP-ROM as a signal source to be detected.

The sense amplifier shown in FIG. 2 will be described first. The source of EP-ROM 5 as the signal source to be detected is grounded, and its drain is connected to the source of n-channel MOS transistor 6 (to be referred to as a NMOS transistor hereinafter). The drain of NMOS transistor 6 is connected to the gate and drain of p-channel MOS transistor 7 (to be referred to as PMOS transistor hereinafter). The drain of NMOS transistor 6 is connected to the drain of p-channel MOS transistor 8 and the gate of n-channel MOS transistor 10 constituting a ratio circuit. The drains of p-channel MOS transistor 9 and NMOS transistor 10 constituting the ratio circuit are connected to each other, and a node of the drains of PMOS and NMOS transistors 9 and 10 is connected to second-stage inverter 11. Power source S is connected to the sources of PMOS transistors 7, 8, and 9. The gates of PMOS transistors 8 and 9 are set to 0 V. The source of NMOS transistors 10 is set to 0 V. Voltage Via having a predetermined level which turns on NMOS transistor 6 is applied to its gate.

An operation of the sense amplifier shown in FIG. 2 will be described below. The operation includes two cases wherein EP-ROM 5 as the signal source to be detected is ON and OFF.

When EP-ROM 5 is ON, all of EP-ROM 5, NMOS transistors 5 and 6, and PMOS transistor 8 and rendered conductive. Therefore, a current flows from power source S to ground E through PMOS transistors 7 and 8, NMOS transistor 6, and EP-ROM 5. The potential at point B is set to power source voltage $V_{DD}$ while EP-ROM 5 is OFF. When EP-ROM 5 is turned on, however, the potential beings to drop. When the potential at point B drops below $V_{DD} - |Vthp|$ (Vthp is the threshold voltage of PMOS transistor 7), PMOS transistor 7 is rendered conductive. Subsequently, a current also flows from power source S on the side of the source of PMOS transistor 7. The potential at point B is then set to voltage $V_{ON}$ which is the value obtained by dividing source voltage $V_{DD}$ by the parallel ON resistance of PMOS transistors 7 and 8, and the ON resistance of NMOS transistor 6, and EP-ROM 5.

When EP-ROM 5 is turned off, circuit capacitances such as a wiring capacitance and capacitances of the diffusion layers of NMOS transistor 6 and PMOS transistors 7 and 8 connected to point B are charged by PMOS transistors 7 and 8 from $V_{ON}$ to power source voltage $V_{DD}$. In the conventional sense amplifier, since the circuit capacitances connected to point B are charged only through PMOS transistor 8 having a high ON resistance, the charging speeds are low. In contrast to this, in the sense amplifier shown in FIG. 2, since the drain and gate of PMOS transistor 7 are connected to each other and the ON resistance of transistor 7 is very small, the circuit capacitances connected to point B can be charged at a speed much higher than that in the conventional sense amplifier until the potential at point B reaches $V_{DD} - |Vthp|$. When the potential at point B exceeds $V_{DD} - |Vthp|$, PMOS transistor 7 is rendered nonconductive. While the potential at point B reaches from $V_{DD} - |Vthp|$ to $V_{DD}$, the circuit capacitances connected to point B are charged by power source S only through PMOS transistor 8.

An operation of the ratio circuit constituted by PMOS transistor 9 and NMOS transistor 10 will be described below.

PMOS transistor 9 is always set in a conductive state because 0 V is applied to its gate. Power source voltage $V_{DD}$ or voltage $V_{ON}$ is applied to the gate of NMOS transistor 10. Consequently, NMOS transistor 10 is always set in a conductive state. When a voltage applied to the gate of NMOS transistor 10 is changed, its ON resistance is changed. When the ON resistance of NMOS transistor 10 is changed, the potential at the output portion (point C) of the ratio circuit is changed. In order to operate inverter 11 of the next stage, the voltage applied to point C must be either higher or lower than threshold value Vth. The voltage applied to point C is determined by the ratio of the ON resistance of PMOS transistor 9 to the ON resistance of NMOS transistor 10. In addition, since the gate of PMOS transistor 9 is grounded, the ON resistance of PMOS transistor 9 is kept unchanged. Therefore, the voltage applied to point C is adjusted by the ON resistance ratio of PMOS and NMOS transistors 9 and 10 which is changed by changing the ON resistance of NMOS transistor 10. If the potential at point B is power source voltage $V_{DD}$, the ON resistance of NMOS transistor 10 is decreased, and the voltage applied to point C drops below threshold voltage Vth of inverter 11 in accordance wiht the ON resistance ratio of NMOS transistor 10 to PMOS transistor 9. If the potential at point B is $V_{ON}$, the ON resistance of NMOS transistor 10 is increased, and the voltage applied to point C exceeds threshold voltage Vth of inverter 11 in accordance with the ON resistance ratio of NMOS transistor 10 to PMOS transistor 9. Since the voltage applied to point C is set to be either higher or lower than threshold voltage Vth of inverter 11, inverter 11 is normally operated. As a result, the potential at output OUT is set to either $V_{DD}$ or 0 V.

The sense amplifier shown in FIG. 3 will be described below. The circuit shown in FIG. 3 is different from the circuit in FIG. 2 only in the ratio circuit. Therefore, only an arrangement of the ratio circuit will be described. In the circuit shown in FIG. 2, the drain of NMOS transistor 6 is connected to the gate of NMOS transistor 10 of the ratio circuit. However, in the circuit shown in FIG. 3, the drain of NMOS transistor 6 is connected to the gate of PMOS transistor 9. Furthermore, in the circuit shown in FIG. 3, power source voltage $V_{DD}$ is applied to the gate of NMOS transistor 10. The drains of PMOS and NMOS transistors 9 and 10 are connected to each other, and node E thereof is connected to inverter 11 of the next stage.

An operation of the circuit in FIG. 3 will be described below. The voltage applied to node D of the drain fo PMOS transistor 8 and the gate of PMOS transistor 9 in the circuit shown in FIG. 3, and the voltage applied to point B in the circuit shown in FIG. 2 are the same, which is either power source voltage $V_{DD}$ or voltage $V_{ON}$, i.e., the voltage obtained by dividing power source voltage $V_{DD}$ by the parallel ON resistance of PMOS transistors 7 and 8, and the ON resistances of NMOS transistor 6 and EP-ROM 5. Each of the two voltages is applied to the gate of PMOS transistor 9. NMOS transistor 10 is always set in a conductive state because power source voltage $V_{DD}$ is applied to its gate. Since PMOS transistor 9 is rendered nonconductive when power source voltage $V_{DD}$ is applied to the gate of PMOS transistor 9, the voltage applied to point E becomes 0 V. As a result, output OUT of inverter 11 is set to power source voltage $V_{DD}$. When voltage $V_{ON}$ is applied to the gate of PMOS transistor 9, transistor 9 is rendered conductive. Subsequently, point E is set to a potential higher than threshold voltage Vth of inverter 11 of the next stage in accordance with the ON resistance ratio of NMOS transistor 10 to PMOS transistor 9. As a result, output OUT of inverter 11 is set to 0 V. Accordingly, even if the ratio circuit is modified, the circuits shown in FIGS. 2 and 3 are operated in the same manner.

As has been described above, by adding PMOS transistor 7 whose gate and drain are set at the same potential to a sense amplifier, the operation speed of the sense amplifier is greatly increased especially when an EP-ROM cell is turned off.

Note that NMOS transistor 6 is a transistor for voltage control, and is used to prevent a high voltage from being applied to the sense amplifier when the EP-ROM cell is written.

What is claimed is:

1. A sense amplifier, comprising:
   a signal source to be detected;
   a first MOS transistor, one end of a channel conductive path of which is connected to said signal source, and gate of which is grounded, for causing a current from a power source to flow toward said signal source when said signal source is turned on;
   second MOS transistor, a gate and one end of a channel conductive path of which are connected to said signal source, for quickly increasing potential at a node between said signal source and said first MOS transistor to $V_{DD}-|Vthp|$ ($V_{DD}$: a power source voltage, Vthp: a threshold value of said second MOS transistor) after said signal source is switched from an ON state to an OFF state;
   a ratio circuit constituted by a third MOS transistor having a constant ON resistance and a fourth MOS transistor having a ON resistance changed in accordance with a change in potential at the node, for changing an output in accordance with a change in ON resistance of said fourth MOS transistor; and
   an inverter for inverting the output from said ratio circuit.

2. A sense amplifier according to claim 1, wherein said signal source to be detected comprises an EP-ROM.

3. A sense amplifier, comprising:
   a signal source, one end of which is grounded;
   a first MOS transistor of a first channel type, one end of a channel conductive path of which is connected to the other end of said signal source, and a gate of which is grounded, for constituting a current path together with said signal source, said current path allowing a current from a power source to flow in a ground direction;
   a second MOS transistor of the first channel type, a gate and one end of a channel of which are connected to the other end of said signal source, for quickly incresing potential at a node between said signal source and said first MOS transistor of the first channel type to $V_{DD}-|Vthp|$ ($V_{DD}$: a power source voltage, Vthp: a threshold voltage of said second MOS transistor of the first channel type) after said signal source is switched from an ON state to an OFF state;
   a ratio circuit, constituted by a third MOS transistor of the first channel type, a gate of which is grounded, and which has a constant ON resistance, and a fourth MOS transistor of a second channel type, a gate of which is connected to the node between said signal source and said first MOS transistor of the first channel type and which has an ON resistance changed in accordance with a change in potential at the node, for changing an output in accordance with a change in ON resistance of said fourth MOS transistor of the second type; and
   an inverter for inverting the output from said ratio circuit.

4. A sense amplifier according to claim 3, wherein said signal source comprises an EP-ROM.

5. A sense amplifier, comprising:
   signal source, one end of which is grounded;
   a first MOS transistor of a first channel type, one end of a channel conductive path of which is connected to the other end of said signal source, and a gate of which is grounded, for constituting a current path together with said signal source, said current path allowing a current from a power source to flow in a ground direction;
   a second MOS transistor of the first channel type, a gate and one end of a channel of which are conneted to the other end of said signal source, for quickly increasing potential at a node between said signal source and said first MOS transistor of the first channel type to $V_{DD}-|Vthp|$ ($V_{DD}$: a power source voltage, Vthp: a thershold voltage of said second MOS transistor of the first channel type) after said signal source is switched from an ON state to an OFF state;
   a ratio circuit, constituted by a third MOS transistor of a second channel type, a gate of which is connected to a power source, and which has a constant ON resistance, and a fourth MOS transistor of the first channel type, a gate of which is connected to the node between said signal source and said second MOS transistor of the first channel type and which has an ON resistance changed in accordance with a change in potential at the node, for changing an output in accordance with a change in ON resistance of said fourth MOS transistor of the first type; and
   an inverter for inverting the output from said ratio circuit.

6. A sense amplifier according to claim 5, wherein said signal source comprises an EP-ROM.

7. A sense amplifier according to claim 1, wherein said inverter comprises a CMOS inverter.

8. A sense amplifier according to claim 3, wherein said inverter comprises a CMOS inverter.

9. A sense amplifier according to claim 5, wherein said inverter comprises a CMOS inverter.

* * * * *